United States Patent

(12) United States Patent
Shkidt

(10) Patent No.: US 7,876,135 B2
(45) Date of Patent: Jan. 25, 2011

(54) POWER-ON RESET CIRCUIT

(75) Inventor: Alexei Shkidt, Newark, CA (US)

(73) Assignee: Spectra Linear, Inc., Santa Clara, CA (US)

( * ) Notice: Subject to any disclaimer, the term of this patent is extended or adjusted under 35 U.S.C. 154(b) by 0 days.

(21) Appl. No.: 12/395,781

(22) Filed: Mar. 2, 2009

(65) Prior Publication Data

US 2009/0219066 A1 Sep. 3, 2009

Related U.S. Application Data

(60) Provisional application No. 61/032,816, filed on Feb. 29, 2008.

(51) Int. Cl.
*H03L 7/00* (2006.01)

(52) U.S. Cl. ........................ 327/143; 327/142
(58) Field of Classification Search ................ 327/142, 327/143
See application file for complete search history.

(56) References Cited

U.S. PATENT DOCUMENTS

| | | | | |
|---|---|---|---|---|
| 5,680,359 | A * | 10/1997 | Jeong | 708/620 |
| 6,052,020 | A * | 4/2000 | Doyle | 327/539 |
| 6,281,743 | B1 * | 8/2001 | Doyle | 327/539 |
| 6,667,925 | B2 * | 12/2003 | Kobayashi et al. | 365/211 |
| 7,033,072 | B2 * | 4/2006 | Aota et al. | 374/178 |
| 7,038,967 | B2 * | 5/2006 | Uchikoba et al. | 365/222 |
| 7,084,695 | B2 * | 8/2006 | Porter | 327/512 |
| 7,107,178 | B2 * | 9/2006 | Won et al. | 702/130 |
| 7,372,243 | B2 * | 5/2008 | Kimura | 323/313 |
| 7,532,996 | B2 * | 5/2009 | Kobayashi et al. | 702/130 |
| 7,579,898 | B2 * | 8/2009 | Soldera et al. | 327/512 |
| 7,612,588 | B2 * | 11/2009 | Kimura | 327/143 |
| 7,689,182 | B1 * | 3/2010 | Bosley et al. | 455/127.1 |
| 2005/0264971 | A1 * | 12/2005 | Morino | 361/103 |
| 2007/0046363 | A1 * | 3/2007 | Tanzawa | 327/539 |
| 2007/0257642 | A1 * | 11/2007 | Xiao et al. | 320/134 |
| 2009/0201067 | A1 * | 8/2009 | Haneda | 327/306 |

* cited by examiner

*Primary Examiner*—Lincoln Donovan
*Assistant Examiner*—Adam D Houston
(74) *Attorney, Agent, or Firm*—Holland & Hart

(57) ABSTRACT

A power-on reset circuit produces a reset signal output configured by an upper trip-point in an input hysteresis characteristic of the circuit. The upper trip-point is configured by resistances of a first pair of resistors coupled in series at an internal voltage reference node. A temperature coefficient of the upper trip-point is configured by resistance values of a second pair of resistors where each resistor is coupled with a corresponding switching device with an associated switching threshold. A magnitude of the input hysteresis characteristic is configured by resistances of a third pair of resistors in series. The magnitude of hysteresis is configured independent of configuring either the level or the temperature coefficient of the upper trip-point.

22 Claims, 5 Drawing Sheets

POWER-ON RESET CIRCUIT

CROSS-REFERENCES

This application claims priority from co-pending U.S. Provisional Patent Application No. 61/032,816, filed Feb. 29, 2008, entitled "POWER-ON RESET CIRCUIT", which is hereby incorporated by reference, as if set forth in full in this document, for all purposes.

BACKGROUND

The present invention relates generally to integrated circuits, and more particularly to power-on reset circuits.

In many typical electronic applications, it is desirable to reduce power, for example, to manage thermal or battery powered operating budgets. Reducing power may involve minimizing the amount of current drawn by elements of the circuit. One way of lowering an average operating current of a circuit is to provide power down modes, which deactivate portions of the circuit while not in use. When these circuits power back up, however, they may need to power-up in a known state.

Powering up circuits in a known state may be accomplished by using a power-on reset ("POR") circuit to provide a reset signal to the circuit. For example, when a portion of the circuit is in power-down mode, the operating voltage may drop, causing the reset signal to be provided in a low state. When the portion of the circuit powers back up, the operating voltage rises, ultimately crossing some threshold level (e.g., a minimum voltage level at which memory portions of the circuit can operate normally), causing the reset signal to switch to a high state. Implementing this POR circuit functionality may involve contending with at least three concerns: shrinking operating voltages, CMOS process compatibility, and temperature sensitivity.

As critical dimensions for integrated circuits continue to shrink, the maximum operating voltage of the circuits also may decrease. Lower operating voltages may tend to prevent large electric fields from damaging the circuit structures such as gate oxide, diffusion depletion regions, and various insulating layers. Therefore, it is often desirable to manufacture integrated circuits in advanced semiconductor technologies to be capable of operating at low voltages, thereby providing compatibility with the maximum operating voltages of particular semiconductor technologies.

At these shrinking operating voltages, the voltage margin available to the POR circuit to make the 'above' or 'below' decision may be reduced, increasing the importance of making more accurate voltage level detection. As such, achieving accurate voltage level detection may become increasingly difficult as the operating voltage decreases. Also, because a POR circuit continually monitors the supply voltage, it is active during power-down modes. Thus, it may be desirable for the POR circuit to draw extremely small amounts of current, for example, to extend battery life.

Thus, it may be desirable to provide a POR circuit that is relatively accurate even in low voltage environments, while also consuming relatively small amounts of power.

BRIEF SUMMARY

Among other things, embodiments include methods and systems for providing POR functionality that is relatively accurate in low voltage environments, while also consuming relatively small amounts of power. In some embodiments, bi-polar CMOS ("BiCMOS") devices are used to generate reference and input voltages to a comparison block of a POR circuit, allowing precise control of trip points and temperature coefficients even with a low supply voltage. Certain embodiments provide further functionality, including source voltage adjustment, hysteresis control, and/or under-voltage protection.

In one set of embodiments, a power-on reset device is provided. The power-on reset device includes: a reference generator module, coupled with a supply voltage, and configured to generate a reference level at a reference level node, the reference level having a first temperature coefficient; an input generator module, coupled with the supply voltage, and configured to generate an input level at an input level node, the input level having a second temperature coefficient, the second temperature coefficient being proportional to the first temperature coefficient; a comparison module, having a positive input terminal and a negative input terminal, the positive input terminal being coupled with the input level node and the negative input terminal being coupled with the reference level node, the comparison module being configured to produce an upward transition in an output level when the input level on the positive input terminal exceeds the reference level on the negative input terminal, the input level exceeding the reference level defining a trip-point, and the trip point having a third temperature coefficient functionally related to a difference between the first temperature coefficient and the second temperature coefficient over a change in temperature.

In some embodiments, the power-on reset device further includes a hysteresis module, configured to be enabled as a function of the output level to adjust a relationship between the supply voltage and the trip point, such that: the trip point occurs at a first magnitude of the supply voltage when the hysteresis module is enabled; and the trip point occurs at a second magnitude of the supply voltage when the hysteresis module is not enabled. In other embodiments, the power-on reset device further includes an under-voltage protection module, configured to: monitor the output level to determine whether the output level is high; monitor a magnitude of the supply voltage to determine whether the magnitude of the supply voltage is greater than a threshold level; and transition a protected output level to high only when the output level is high and the magnitude of the supply voltage is greater than the threshold level. In still other embodiments, the power-on reset device further includes a voltage adjustment module, configured to receive a system voltage and generate the supply voltage as a function of the system voltage.

In another set of embodiments, another power-on reset device is provided. The power-on reset device includes: a comparator having a positive input node and a negative input node, the comparator configured to produce an upward transition in an output signal logic level when an upper trip-point is exceeded and a downward transition in the output signal logic level when a lower trip-point is exceeded, a magnitude of voltage difference between the upper and lower trip-points defining a magnitude of hysteresis; a first resistor coupled between a first voltage supply node and the negative input node; a first transistor coupled between the negative input node and ground; a second resistor coupled to the first voltage supply node; a third resistor coupled to the second resistor and the positive input node; a second transistor coupled to ground; a fourth resistor coupled to the positive input node and the second transistor; a fifth resistor coupled to a second voltage supply node and the first voltage supply node; a sixth resistor coupled between the first voltage supply node and ground; an inverter coupled to an output of the comparator; and a hysteresis device coupled to the first voltage supply node and a series coupling point between the second resistor and the third resistor.

In yet another set of embodiments, a method is provided for generating a power-on reset output. The method includes: generating a reference level from a supply voltage, the reference level having a first temperature coefficient; generating an input level as a function of the supply voltage, the input level having a second temperature coefficient, the second temperature coefficient being functionally related to the first temperature coefficient; and generating an output level as a function of a comparison between the input level and the reference level, the output level having a third temperature coefficient that is functionally related to the first temperature coefficient and the second temperature coefficient. In some embodiments, the method further includes selecting at least a first load component for generating the reference level; and selecting at least a second load component for generating the input level, wherein the third temperature coefficient is functionally related to a ratio between the first load component and the second load component.

In certain embodiments, the method further includes generating a magnitude of hysteresis as a function of the output level, such that the output level is configured to transition from low to high at a first trip point and to transition from high to low at a second trip point. In other embodiments, the method further includes monitoring the output level to determine whether the output level is high; monitoring a magnitude of the supply voltage to determine whether the magnitude of the supply voltage is greater than a threshold level; and generating a protected output level as a function of monitoring the output level and of monitoring the magnitude of the supply voltage, such that the protected output level is configured to transition to high only when the output level is high and the magnitude of the supply voltage is greater than the threshold level. In still other embodiments, the method further includes adjusting a system voltage to generate the supply voltage.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components (e.g., a lower-case character). If only the first reference label is used in the specification, the description is applicable to any one of the similar components having the same first reference label irrespective of the second reference label.

DETAILED DESCRIPTION OF THE INVENTION

Various embodiments of the invention provide power-on reset functionality with certain features. For example, embodiments may provide highly accurate voltage level detection, adjustable temperature coefficient, adjustable hysteresis, reliable operation in low power supply voltage environments, minimal power consumption, and/or topologies that can be readily implemented using standard CMOS semiconductor fabrication technologies.

Figure 1:
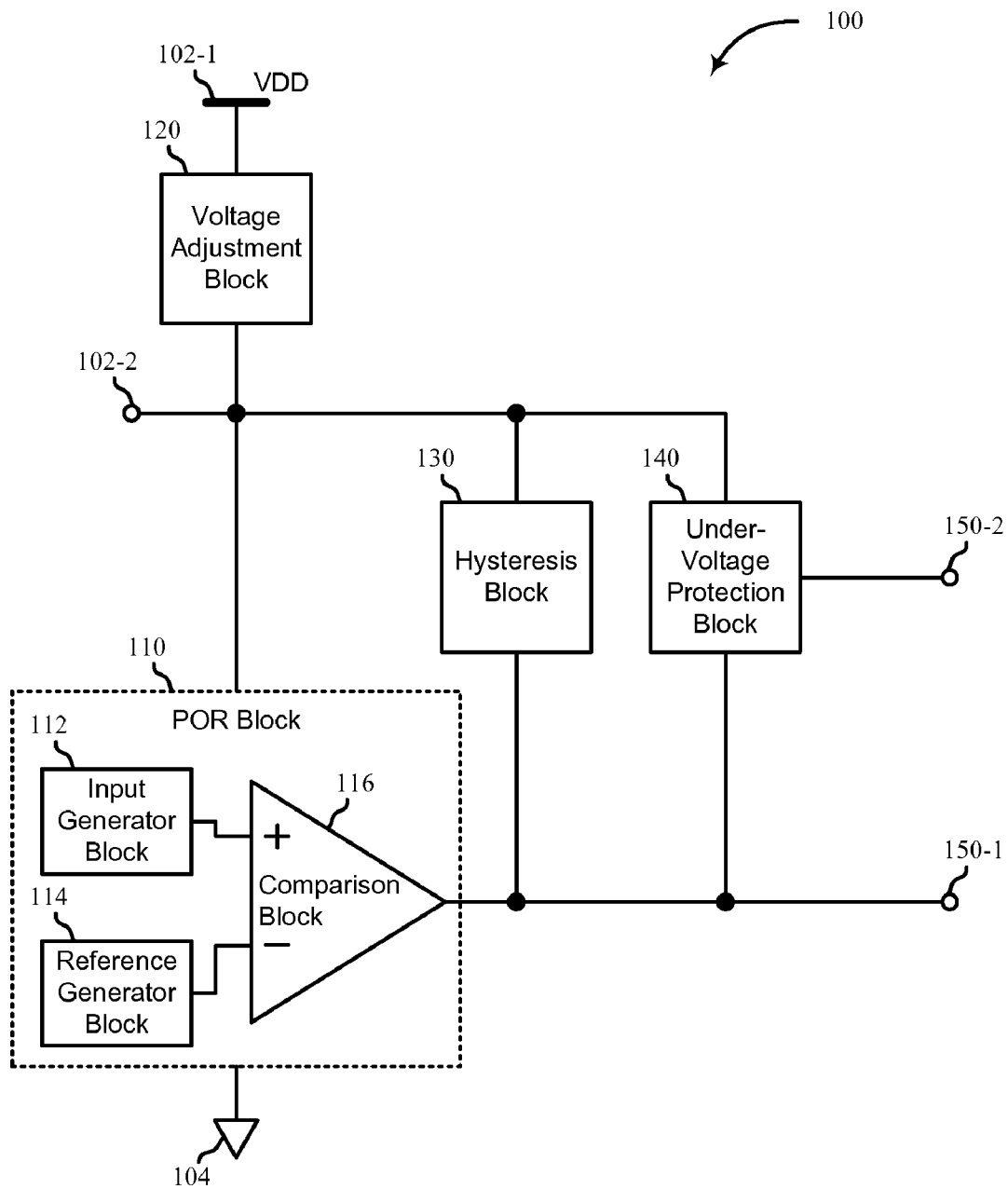
FIG. 1 shows a simplified block diagram of a POR circuit, according to various embodiments of the invention.

FIG. 1 shows a simplified block diagram of a POR circuit 100, according to various embodiments of the invention. The POR circuit 100 includes a POR block 110, a voltage adjustment block 120, a hysteresis block 130, and an under-voltage protection block 140. Embodiments of the voltage adjustment block 120 adjust a system supply voltage 102-1 to generate a POR supply voltage 10-2. For example, the POR may be designed to operate at a POR supply voltage 102-2 of 3V. If the system supplies a system supply voltage 102-1 of 5V when powered up, it may be desirable to use the voltage adjustment block 120 to step down the system supply voltage 102-1 to the desired POR supply voltage 102-2.

Embodiments of the POR block 110 include an input generator block 112 that generates an input voltage as a function of the supply voltage, and a reference generator block 114 that generates a stable reference voltage. The input voltage and the reference voltage are compared with a comparison block 116, which outputs a POR output level 150-1 as a function of the comparison. For example, when the input voltage crosses a certain trip point (e.g., set as a function of the reference voltage and, in some embodiments, the hysteresis block, as explained below), the POR output level 150-1 may transition from one state to another. It will be appreciated that, in many applications (e.g., as system operating voltages shrink, or as operating temperatures range widely), it may be desirable to ensure that the generated reference voltage remains highly accurate and predictable. As explained more fully below, embodiments of the reference generator block 114 are configured to generate a stable reference voltage, even in low operating voltage environments.

When a portion of a system having the POR circuit 100 powers down, the system supply voltage 102-1 may drop. This may cause the input voltage to fall below the reference voltage, causing the POR output level 150-1 to transition to a low state. When the portion of the system powers back up, the system supply voltage 102-1 may rise. This may ultimately cause the input voltage to return to a level exceeding the reference voltage, causing the POR output level 150-1 to transition to a high state. In each case, the POR output level 150-1 transitions when the input voltage crosses a trip point.

In some embodiments, the trip point is the same for the power up and power down conditions. For example, the POR output level 150-1 transitions whenever the input voltage crosses substantially 1.25V, regardless of whether the crossing is from high to low or from low to high. In other embodiments, however, the hysteresis block 130 causes the trip point for the power up condition to be different from the trip point for the power down condition. For example, the POR output level 150-1 may transition from high to low when the input voltage drops below 1.05V, while the POR output level 150-1 may not transition from low to high until the input voltage exceeds 1.25V.

Further, the trip point (or trip points) may be configured to have a temperature coefficient that is positive, negative or zero. In one embodiment, the reference voltage has a first temperature coefficient that is negative by a certain magnitude, and the input voltage has a second temperature coefficient that is negative by a magnitude smaller than that of the first temperature coefficient. Thus, as the temperature increases, the difference between the first and second temperature coefficients may increase. A trip point may be configured to have a third temperature coefficient that is a function of the absolute value of the difference between the first and second temperature coefficients. By adjusting the functional relationships, the POR circuit 100 can be configured so that the temperature coefficients substantially precisely compensate, making the third temperature coefficient seen at the trip point be substantially zero. By over- or under-compensating, the third temperature coefficient may be positive or negative, as desired.

Certain embodiments of the POR circuit 100 include additional functionality. In some embodiments, the under-voltage protection block 140 is included to provide further protection from undesirable operation of the POR circuit 100 in low operating voltage environments. Embodiments of the under-voltage protection block 140 prevent the POR output level 150-1 from transitioning to a high level when one of the supply voltages 102 is below a certain threshold level. Instead, the under-voltage protection block 140 outputs a protected POR output level 150-2. When the under-voltage protection block 140 is used to provide the protected POR output level 150-2, the unprotected POR output level 150-1 may typically not be provided.

While there may be many ways to implement some of the functionality of the POR circuit 100, it may be desirable for the implementation to address one or more of a number of issues. For example, it may be difficult to use standard CMOS technology to generate a reference voltage that is well controlled over a range of temperatures, voltages, and/or process variations. Some typical implementations use a depletion mode MOS device in series with an enhancement mode MOS device to set the reference voltage. However, this approach may be limited by the accuracy of the MOS devices, which may be limited over certain temperatures, voltages, and/or process variations. Further, it may be undesirable in some applications to use a depletion mode MOS device. Some other typical implementations use a current source in place of the depletion mode MOS device. While this may avoid issues with acquiring or using depletion mode devices, the accuracy may remain limited over certain temperatures, voltages, and/or process variations.

Figure 2:
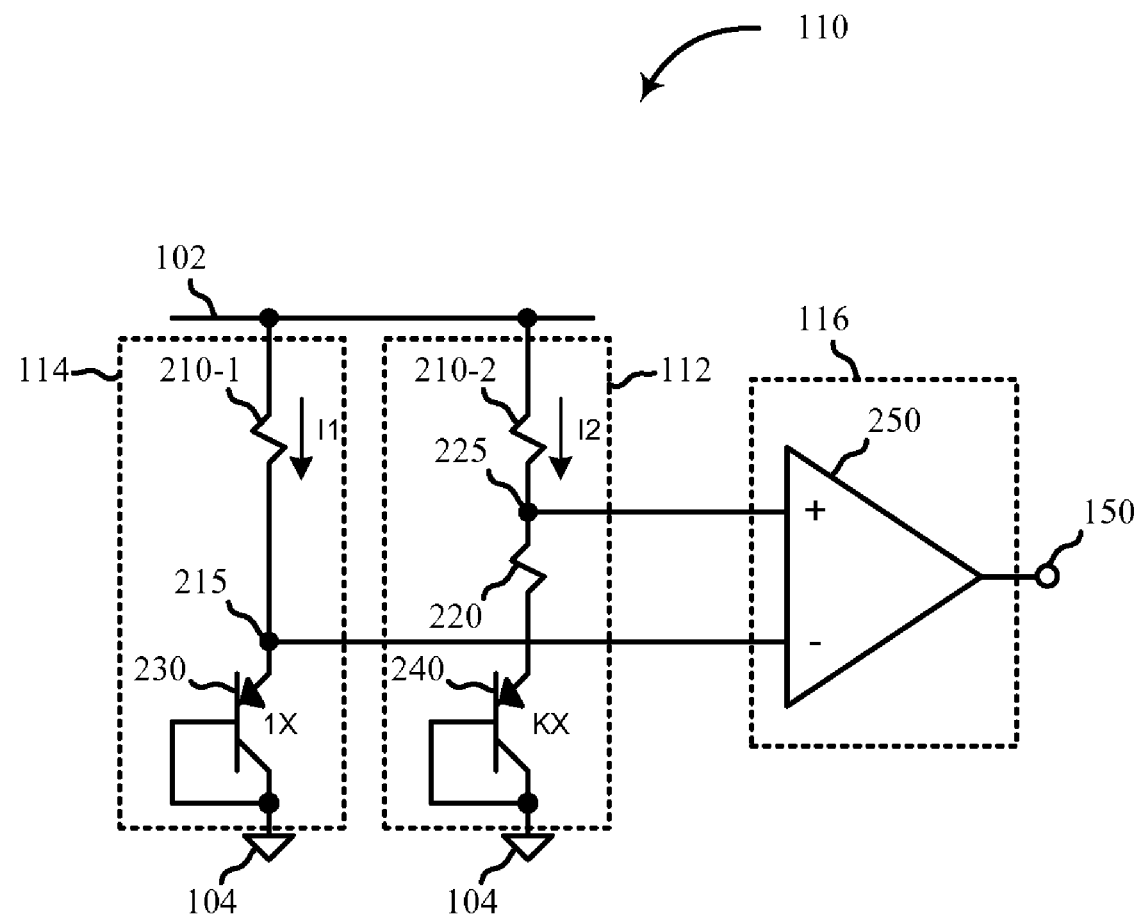
FIG. 2 shows a schematic diagram of an illustrative circuit for implementing a POR block for use in a POR circuit, according to various embodiments of the invention.

FIG. 2 shows a schematic diagram of an illustrative circuit for implementing a POR block 110 for generating a reliable reference voltage using standard CMOS technology, according to various embodiments of the invention. The POR block 110 includes an input generator block 112 that generates an input voltage as a function of a supply voltage 102 ("VDD"), and a reference generator block 114 that generates a reference voltage. The input voltage and the reference voltage are compared with a comparison block 116, which outputs a POR output level 150 as a function of the comparison.

The comparison block 116 includes a comparator 250 having a negative input terminal, a positive input terminal, and an output in communication with a POR output level 150 node. The reference generator block 114 includes a first resistor 210-1 ("R1") and a first transistor 230, connected in series between the supply voltage 102 and ground 104. The first transistor 230 may be configured substantially as a diode (e.g., with its base and collector tied together), such that the base-emitter voltage is substantially equal to the voltage across the first transistor 230. The first resistor 210-1 and the first transistor 230 are connected at a reference level node 215, which is in communication with the negative input terminal of the comparator 250. The voltage at the reference level node 215 will be substantially the voltage across the first transistor 230 ("VBE1"). The magnitude of current flowing through the reference level node 215 ("I1") may be calculated as follows:

$$I1 = \frac{VDD - VBE1}{R1}. \quad \text{(Eq. 1a)}$$

The input generator block 112 includes a second resistor 210-2 ("R2"), a third resistor 220 ("R3"), and a second transistor 240, connected in series between the supply voltage 102 and ground 104. The second transistor 240 may be configured substantially as a diode (e.g., with its base and collector tied together), such that the base-emitter voltage is substantially equal to the voltage across the second transistor 240. The second resistor 210-1 and the third resistor 220 are connected at an input level node 225, which is in communication with the positive input terminal of the comparator 250. The voltage at the input level node 225 ("VX") will be substantially the sum of the voltage across the third resistor 220 and the voltage across the second transistor 240 ("VBE2"). The magnitude of current flowing through the input level node 225 ("I2") may be calculated as follows:

$$I2 = \frac{VDD - VBE2}{R2 + R3}. \quad \text{(Eq. 1b)}$$

Embodiments of the POR block 110 are implemented using parasitic substrate PNP transistors (e.g., as the first transistor 230 and the second transistor 240). For example, the POR block 110 may be implemented completely using a standard CMOS process. While different component characteristics, the following equations will assume certain illustrative component characteristics. Particularly, for the sake of clarity, the equations will assume that the second transistor is sized to have an emitter area that is K times the emitter area of the first transistor 230 (where K is a selected constant value), and that the first resistor 210-1 and the second resistor 210-2 have substantially equal resistance values.

It will be appreciated that the POR output level 150 transitions from low (e.g., a low logic level) to high (e.g., a high logic level) when the supply voltage 102 causes the voltage level at the input level node 225 to exceed the voltage level at the reference level node 215. A relationship between the supply voltage 102 and the POR output level 150 may be calculated by the following equations. The voltage level at the input level node 225 is related to the voltage across the second transistor 240 and the value of the third resistor 220 as follows:

$$VX = I2 * R3 + VBE2 \quad \text{(Eq. 2).}$$

At the trip point of the comparator 250, the voltage levels at the reference level node 215 and the input level node 225 are substantially equal (assuming the comparator 250 has no hysteresis). As such, at the trip point, VX is substantially equal to VBE1. If the first resistor 210-1 and the second resistor 210-2 have substantially equal resistance values, I1 will be substantially equal to I2 at the trip point. Under this trip point condition, Equation 2 may be re-written as follows:

$$VBE1 - VBE2 = I1 * R3 \quad \text{(Eq. 3).}$$

The voltage across the first transistor 230 and the voltage across the second transistor 240 may each be calculation in relation to their respective current densities. The relationship between the voltages depends on the respective gains of the first transistor 230 and the second transistor 240, and may be calculated as follows:

$$VBE1 - VBE2 = V_T * \ln\left(\frac{I1}{IS}\right) - V_T * \ln\left(\frac{I2}{K*IS}\right), \quad \text{(Eq. 4)}$$

where IS=bipolar saturation current, K=emitter area ratio, and $$V_T = \frac{kT}{q}.$$

Again, at the trip point of the comparator, I1 is substantially equal to I2, allowing Equation 4 to be reduced to the following:

$$VBE1 - VBE2 = V_T * \ln(K) \quad \text{(Eq. 5)}.$$

By setting Eq. 3 equal to Eq. 5 and substituting Eq. 1a for I1, the following may be calculated:

$$V_T * \ln(K) = \left(\frac{VDD - VBE1}{R1}\right) * R3. \quad \text{(Eq. 6)}$$

Reformatting the expression to express the trip-point with respect to VDD may yield the following:

$$VDD = \left(\frac{R1}{R3}\right) * V_T * \ln(K) + VBE1. \quad \text{(Eq. 7)}$$

Equation 7 shows that the trip point may be set by the ratio of resistance values of the first resistor 210-1 and the third resistor 220. Further, it will be appreciated that the POR block 110 topology may operate in low supply voltage 102 environments, by tripping at or near the bandgap voltage of the first transistor 230 and/or the second transistor 240 (e.g., around 1.2V). Even further, Equation 7 shows that the topology of the POR block 110 may provide a stable reference voltage level and a trip point that is substantially independent of changes in temperature.

For example, VBE1 and VBE2 both have a negative temperature coefficient (e.g., as the temperature increases, the respective voltages decrease). However, because of the difference in emitter current densities, VBE1 may decrease at a lower rate (e.g., the slope of the change in VBE2 over temperature may be steeper than the slope of the change in VBE1 over temperature). Because of the difference in slope, there may be an effective positive temperature coefficient on the differential voltage between VBE1 and VBE2. As shown in Equation 7, the apparent positive temperature coefficient on the differential voltage between VBE1 and VBE2 may be set by the ratio of the third resistor 220 to the first resistor 210-1 (e.g., or the second resistor 210-2, which is substantially equal to the first resistor 210-1). As such, the apparent temperature coefficient of the trip point may be set to be zero, positive, or negative as a function of the ratio of the third resistor 220 to the first resistor 210-1.

Figure 3:
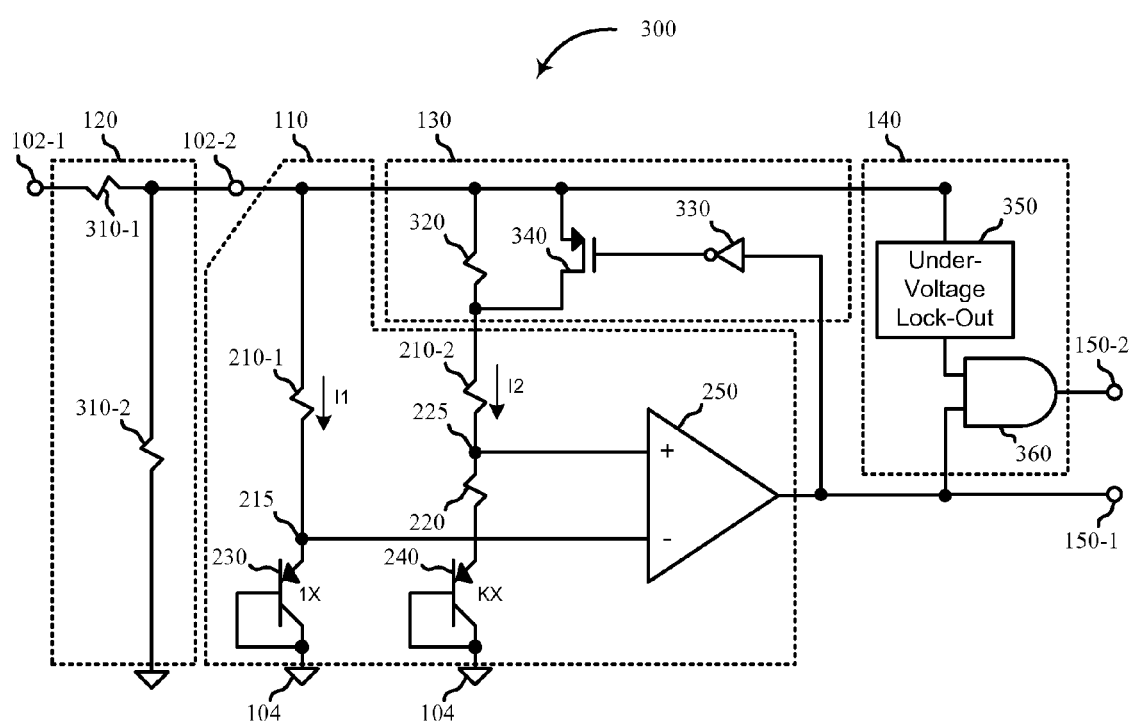
FIG. 3 shows a schematic diagram of a POR circuit integrating additional functionality with a POR block, according to various embodiments of the invention.

It will be appreciated that the functionality of the POR block 110 may be implemented in a number of different ways, according to embodiments of the invention. Further, additional functionality may be added to or integrated with the POR block 110 (e.g., as shown in FIG. 1). FIG. 3 shows a schematic diagram of a POR circuit 300 integrating additional functionality with a POR block 110, according to various embodiments of the invention.

The POR circuit 300 includes a POR block 110, a voltage adjustment block 120, a hysteresis block 130, and an undervoltage protection block 140. Embodiments of the voltage adjustment block 120 adjust a system supply voltage 102-1 to generate a POR supply voltage 102-2. For example, the POR may be designed to operate at a POR supply voltage 102-2 of 3V. If the system supplies a system supply voltage 102-1 of 5V when powered up, it may be desirable to use the voltage adjustment block 120 to step down the system supply voltage 102-1 to the desired POR supply voltage 102-2.

In the embodiment shown, the voltage adjustment block 120 includes a first adjustment resistor 310-1 ("$R_{A1}$") and a second adjustment resistor 310-2 ("$R_{A2}$") configured as a voltage divider. The first adjustment resistor 310-1 and the second adjustment resistor 310-2 are connected in series between the system supply voltage 102-1 and ground 104, and are connected to each other at a POR supply node. The resistors are sized to set the voltage at the POR supply node to be the desired POR supply voltage 102-2. It will be appreciated that other implementations are possible for adjusting the voltage supply. For example, active and/or passive implementations of voltage sources or current sources are possible.

Under the condition where the parallel resistance of the first adjustment resistor 310-1 and the second adjustment resistor 310-2 is much less than the equivalent resistance of the parallel combination of the first resistor 210-1 with the series combination of the hysteresis resistor 320, the second resistor 210-2, and the third resistor 220, the detection threshold may be calculated as follows:

$$VDD = \left(\left(\frac{R1}{R3}\right) * V_T * \ln(K) + VBE1\right) * \left(1 + \frac{R_{A1}}{R_{A2}}\right). \quad \text{(Eq. 8)}$$

In Equation 8, VDD is the system supply voltage 102-1. The rightmost term indicates the voltage adjustment provided by the voltage adjustment block 120. It will be appreciated that, if VDD is set to the POR supply voltage 102-2, the rightmost term of the equation drops out, leaving Equation 7 described above. The inclusion of the rightmost term, however, illustrates that under the above-cited conditions, the trip point temperature coefficient may be independent of scaling resistance values for the first adjustment resistor 310-1 and the second adjustment resistor 310-2.

The POR supply voltage 102-2 is used to drive the POR block 110. In some embodiments, the POR block 110 is implemented as the POR block 110 of FIG. 2. The POR block 110 includes a comparator 250 having a negative input terminal, a positive input terminal, and an output in communication with a first POR output level 150-1 node. A first resistor 210-1 ("R1") and a first transistor 230 are connected in series between the supply voltage 102 and ground 104; and are configured to generate a reference voltage level at a reference level node 215 in communication with the negative input terminal of the comparator 250. A hysteresis resistor 320 ("$R_{HYS}$"), a second resistor 210-2 ("R2"), a third resistor 220 ("R3"), and a second transistor 240 are connected in series between the supply voltage 102 and ground 104; and are configured to generate an input voltage level ("VX") at an input level node 225 in communication with the positive input terminal of the comparator 250. The first POR output level 150-1 transitions from low to high when the supply voltage 102 causes the voltage level at the input level node 225 to exceed the voltage level at the reference level node 215.

The first POR output level 150-1 may be fed back through the hysteresis block 130 to provide a different trip point for each transition direction (e.g., low-to-high and high-to-low). The hysteresis block 130 includes an inverter 330 controlling the gate of a hysteresis transistor 340. The hysteresis transistor 340 may be implemented as a PMOS transistor. The hysteresis resistor 320 is connected across the drain and source of the hysteresis transistor 340. When the first POR output level 150-1 at the output of the comparator 250 is low, the output of the inverter 330 is high, causing the hysteresis transistor 340 to turn off (e.g., to stop conducting current). This may effectively adds the hysteresis resistor 320 into the path providing current to the input level node 225. In this configuration, the POR block 110 may look and operate substantially as the POR block 110 of FIG. 2 (e.g., where the sum of resistor 320 and resistor 210-2 is equal to resistor 210-1).

When the first POR output level 150-1 at the output of the comparator 250 transitions to high, the output of the inverter 330 transitions to low, causing the hysteresis transistor 340 to turn on (e.g., to conduct current). This may effectively remove the hysteresis resistor 320 to the path providing current to the input level node 225. Removing the hysteresis resistor 320 may alter the trip point of the circuit. As such, the trip point for each transition direction of the first POR output level 150-1 may be set to different POR supply voltage 102-2 levels.

For example, the high-to-low trip point may effectively be the trip point without the hysteresis resistor 320 in the path, and may be calculated as follows:

$$V_{H-L} = \left\{ \left(\frac{R2}{R3}\right) * V_T * \ln\left(\frac{K*R2}{R1}\right) \right\} * \left(1 + \frac{R_{A1}}{R_{A2}}\right). \quad \text{(Eq. 9)}$$

Similarly, the low-to-high trip point may effectively be the trip point with the hysteresis resistor 320 in the path, and may be calculated as follows:

$$V_{L-H} = \left\{ \begin{array}{c} \left(\frac{R_{HYS}+R2}{R3}\right)*V_T* \\ \ln\left(K\left(\frac{R_{HYS}+R2}{R1}\right)\right) \end{array} \right\} * \left(1 + \frac{R_{A1}}{R_{A2}}\right). \quad \text{(Eq. 10)}$$

The hysteresis may then be expressed as follows:

$$V_{HYS} = \left\{ \begin{array}{c} \left(\frac{R_{HYS}+R2}{R3}\right)*V_T* \\ \ln\left(K\left(\frac{R_{HYS}+R2}{R1}\right)\right) - \left(\frac{R2}{R3}\right)* \\ V_T*\ln\left(\frac{K*R2}{R1}\right) \end{array} \right\} * \left(1 + \frac{R_{A1}}{R_{A2}}\right). \quad \text{(Eq. 11)}$$

It will now be appreciated that the upper trip point temperature coefficient can be adjusted to a negative, zero or positive magnitude measured in parts per million per degree Celsius (ppm/° C.) by adjusting resistor ratios. Further, hysteresis may be added in a manner which does not affect the upper trip-point voltage or its temperature coefficient. The lower trip-point and hysteresis temperature coefficients may depend on the relationship in Eq. 11. Once the temperature coefficient has been selected, the detection level may be adjusted in magnitude through the addition of an external attenuator (e.g., using the voltage adjustment block 120) while maintaining a target temperature coefficient.

In some embodiments, it may be desirable to prevent transitions from occurring when the POR supply voltage 102-2 is too low. Embodiments of the under-voltage protection block 140 may prevent the POR output level 150-1 from transitioning to a high level when the POR supply voltage 102-2 is below a certain threshold level. In some embodiments, the under-voltage protection block 140 includes an under-voltage lock out module 350 and an AND logic gate 360. The under-voltage lock out module 350 outputs a logic high signal only when its input (i.e., the POR supply voltage 102-2 exceeds a threshold voltage (e.g., set internally or externally to the under-voltage lock out module 350). In some embodiments, the under-voltage lock out module 350 is implemented substantially like the POR block 110 (e.g., with a different trip point). In other embodiments, the under-voltage lock out module 350 is implemented as a buffer with an optimized threshold. For example, during abnormal operation of the POR circuit 300, the comparator 250 may transition high at a voltage level that is too low for proper operation of other system components (e.g., memory modules, etc.). The under-voltage lock out module 350 may be configured to effectively gate the first POR output level 150-1 at low voltages to protect from abnormal transitions, without affecting the trip point of the POR circuit 300.

Figure 4:
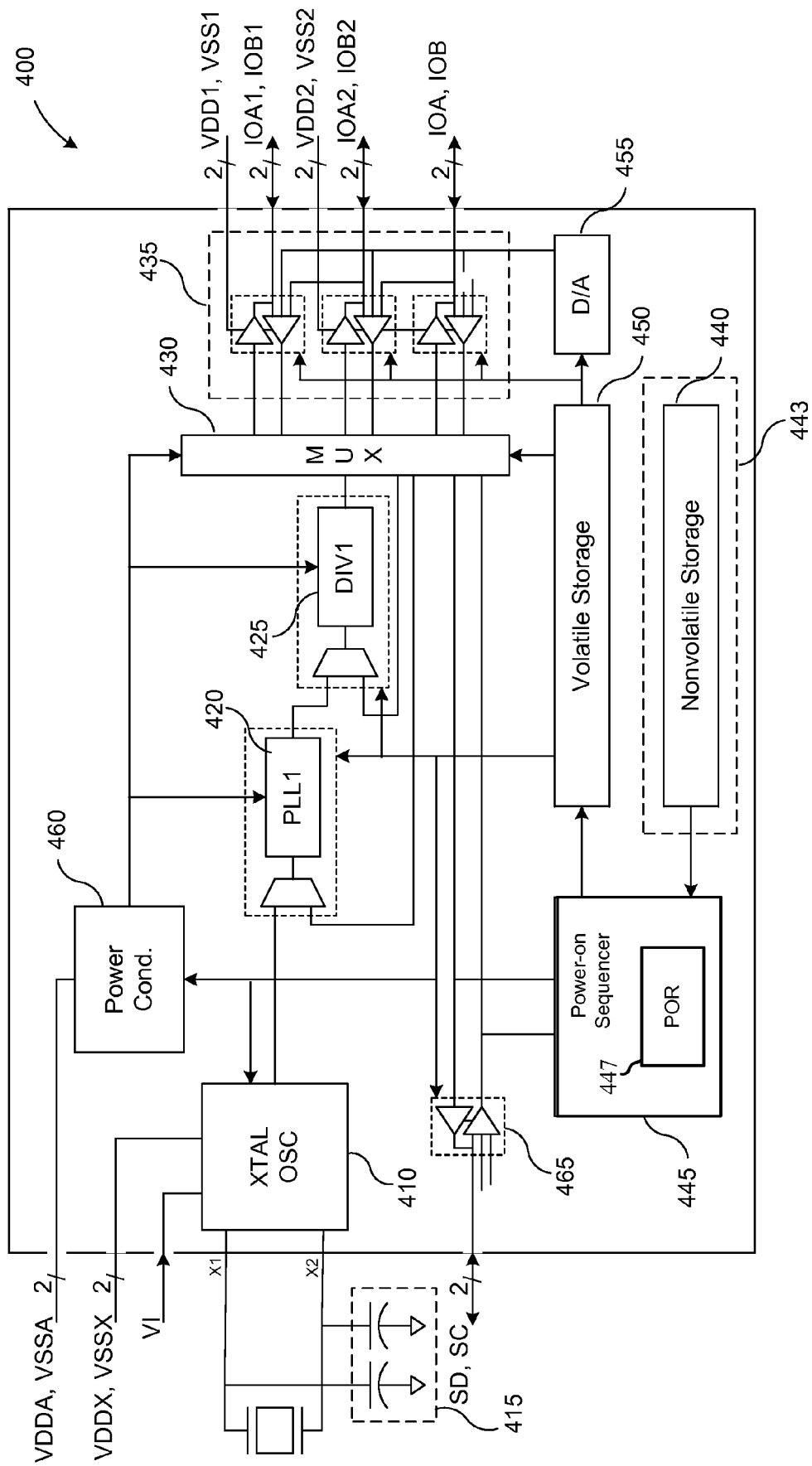
FIG. 4 illustrates a simplified block diagram of a circuit arrangement implementing a clock circuit with an integrated POR circuit, according to various embodiments of the invention.

Embodiments of POR circuitry, like the POR circuit 300 of FIG. 3 may be used with or in many different applications. FIG. 4 illustrates a simplified block diagram of a circuit arrangement 400 implementing a clock circuit with an integrated POR circuit 447, according to various embodiments of the invention. An external crystal connects to a voltage controlled crystal oscillator ("VCXO") 410 in an exemplary embodiment. A pair of capacitors 415 connect crystal oscillator inputs X1, X2 to ground. VCXO power ("VDDX"), VCXO ground ("VSSX"), and VCXO input voltage ("VI") are external inputs to the VCXO 410.

An output of the VCXO 410 is connected with an input multiplexer (mux) of a phase lock loop (PLL1) 420, providing a reference signal for the PLL 420. In some embodiments, additional PLLs 420 may be used to allow for additional I/Os and further programmability. An output of the phase lock loop 420 is connected with an input multiplexer (mux) of a PLL divider (DIV1) 425. An output of the PLL divider 425 is fed to a MUX 430. A first set of outputs of the MUX 430 are connected with programmable input/output buffers 435. Additional outputs from the MUX 430 may be connected with the input mux of PLL1 420 and the input mux of the PLL divider 425.

The clock generator circuit 400, including a nonvolatile storage array 440, may be fabricated, for example, in a single monolithic semiconductor substrate or alternately, the nonvolatile storage array 440 may reside on a second semiconductor substrate 443. An output of the nonvolatile storage array 440 may be in communication with a power-on sequencer 445. The power-on sequencer 445 may communicate with a volatile storage array 450.

The volatile storage array 450 is in communication with a digital-to-analog (D/A) block 455, a power conditioner block 460, a serial I/O block 465, the programmable input/output buffers 435, the mux 430, the PLL 420, the PLL divider 425, and the VCXO 410. The serial I/O block 465 communicates with serial data and serial clock inputs SD, SC, the power-on sequencer 445, and the MUX 430. The power conditioner block 460 is connected with PLL power inputs VDDA, VSSA.

Embodiments of the power-on sequencer 445 contain a POR circuit 447, for example, as part of startup and initialization circuitry. In some embodiments, the POR circuit 447 in the power-on sequencer 445 includes some or all of the POR circuit 100 of FIG. 1 (as implemented by the POR circuit 300 of FIG. 3). These or other embodiments of the POR circuit may be included to ensure that circuitry associated within the circuit arrangement 400 are provided with a power-up condition to produce a known state.

Figure 5:
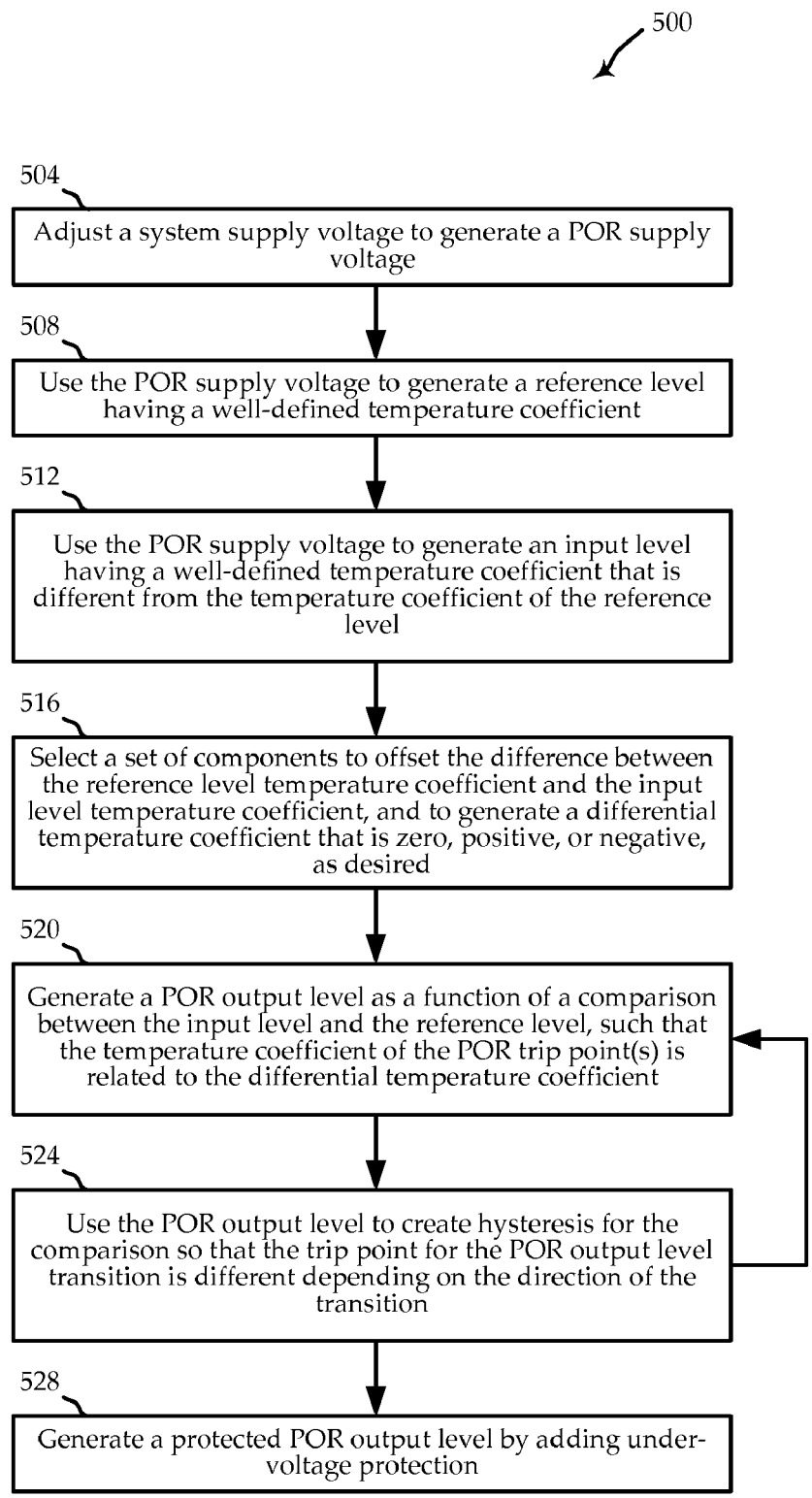
FIG. 5 shows a flow diagram of a method for providing power-on reset functionality, according to various embodiments of the invention.

It will be appreciated that the circuits described above provide only exemplary systems for providing functionality according to embodiments of the invention. For example, those and other embodiments may perform the method of FIG. 5. FIG. 5 shows a flow diagram of a method 500 for providing power-on reset functionality, according to various embodiments of the invention.

In some embodiments, the method 500 begins at block 504 by adjusting a system supply voltage to generate a POR supply voltage. The POR supply voltage may then be used at block 508 to generate a reference level having a well-defined temperature coefficient, and, at block 512, to generate an input level having a well-defined temperature coefficient that is different from the temperature coefficient of the reference level. At block 516, a set of components is selected to offset the difference between the reference level temperature coefficient and the input level temperature coefficient, and to generate a differential temperature coefficient that is zero, positive, or negative, as desired.

At block 520, a POR output level is generated as a function of a comparison between the input level and the reference level, such that the temperature coefficient of the POR trip point is (or is functionally related to) the differential temperature coefficient designed in block 516. In some embodiments, at block 524, the POR output level is used to create hysteresis for the comparison in block 520 so that the trip point for the POR output level transition is different depending on the direction of the transition. In other embodiments, a protected POR output level is generated at block 528 by adding under-voltage protection.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

It should also be appreciated that the following systems and methods may individually or collectively be components of a larger system, wherein other procedures may take precedence over or otherwise modify their application. Also, a number of steps may be required before, after, or concurrently with the following embodiments. Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Accordingly, the above description should not be taken as limiting the scope of the invention, which is defined by the appended claims.

What is claimed is:

1. A power-on reset device comprising:
   a reference generator module, coupled with a supply voltage, and configured to generate a reference level at a reference level node, the reference level having a first temperature coefficient;
   an input generator module, coupled with the supply voltage, and configured to generate an input level at an input level node, the input level having a second temperature coefficient, the second temperature coefficient being proportional to the first temperature coefficient;
   a comparison module, comprising a positive input terminal and a negative input terminal, the positive input terminal being coupled with the input level node and the negative input terminal being coupled with the reference level node, the comparison module being configured to produce an upward transition in an output level when the input level on the positive input terminal exceeds the reference level on the negative input terminal, the input level exceeding the reference level defining a trip-point, the trip point having a third temperature coefficient functionally related to a difference between the first temperature coefficient and the second temperature coefficient over a change in temperature; and
   a voltage adjustment module, configured to receive a system voltage and generate the supply voltage as a function of the system voltage.

2. The power-on reset device of claim 1, wherein:
   the input generator module comprises a first load and a second load; and
   the trip point is configured at least in part by the ratio of the first load to the second load.

3. The power-on reset device of claim 1, wherein:
   the reference generator module comprises:
      a first load block coupled between the voltage supply and the reference level node; and
      a first current control block coupled between the reference level node and ground; and
   the input generator module comprises:
      a second load block coupled between the voltage supply and the input level node;
      a second current control block coupled with ground; and
      a third load block coupled between the input level node and the second current control block.

4. The power-on reset device of claim 1, wherein:
   the reference generator module comprises:
      a first resistor coupled between the voltage supply and the reference level node; and
      a first transistor coupled between the reference level node and ground; and
   the input generator module comprises:
      a second resistor coupled between the voltage supply and the input level node;
      a second transistor coupled with ground; and a third resistor coupled between the input level node and the second transistor.

5. The power-on reset device of claim 4, wherein the trippoint is determined at least by a bandgap reference voltage associated with the first transistor and the second transistor.

6. The power-on reset device of claim 4, wherein the trippoint is determined at least by a bandgap reference voltage corresponding with respective threshold voltages of the first transistor and the second transistor.

7. The power-on reset device of claim 4, wherein:
the first transistor is a bi-polar transistor having a first emitter area; and
the second transistor is a bi-polar transistor having a second emitter area, the second emitter area being a multiple of the first emitter area.

8. The power-on reset device of claim 7, wherein:
at least one of the first transistor or the second transistor is a parasitic bi-polar transistor implemented in a complimentary metal oxide semiconductor (CMOS) process.

9. The power-on reset device of claim 1, further comprising:
a hysteresis module, configured to be enabled as a function of the output level to adjust a relationship between the supply voltage and the trip point, such that:
the trip point occurs at a first magnitude of the supply voltage when the hysteresis module is enabled; and
the trip point occurs at a second magnitude of the supply voltage when the hysteresis module is not enabled.

10. The power-on reset device of claim 9, wherein:
the hysteresis module is enabled when the output level is high; and
the first magnitude of the supply voltage is less than the second magnitude of the supply voltage.

11. The power-on reset device of claim 9, wherein the hysteresis module comprises:
a switching block, configured to be switched to a first mode or a second mode as a function of the output level and to provide a first current path when switched to the first mode; and
a load block, coupled in parallel with the switching block so as to provide a second current path when the switching block is switched to the second mode.

12. The power-on reset device of claim 1, further comprising:
an under-voltage protection module, configured to:
monitor the output level to determine whether the output level is high;
monitor a magnitude of the supply voltage to determine whether the magnitude of the supply voltage is greater than a threshold level; and
transition a protected output level to high only when the output level is high and the magnitude of the supply voltage is greater than the threshold level.

13. The power-on reset device of claim 12,
wherein the voltage adjustment module comprises a voltage divider topology configured to generate the supply voltage as a fraction of the system voltage.

14. The power-on reset device of claim 1, wherein:
the third temperature coefficient is substantially zero.

15. A method for generating a power-on reset output, the method comprising:
receiving a system voltage and generating a supply voltage as a function of the system voltage;
generating a reference level from the supply voltage, the reference level having a first temperature coefficient;
generating an input level as a function of the supply voltage, the input level having a second temperature coefficient, the second temperature coefficient being functionally related to the first temperature coefficient; and
generating an output level as a function of a comparison between the input level and the reference level, the output level transitioning between low and high at a trip point having a third temperature coefficient that is functionally related to the first temperature coefficient and the second temperature coefficient.

16. The method of claim 15, further comprising:
selecting at least a first load component for generating the reference level; and
selecting at least a second load component for generating the input level,
wherein the third temperature coefficient is functionally related to a ratio between the first load component and the second load component.

17. The method of claim 16, wherein the second load component is selected at least partially to provide an offset temperature coefficient, the offset temperature coefficient being configured to at least partially offset a difference between the first temperature coefficient and the second temperature coefficient.

18. The method of claim 15, further comprising:
generating a magnitude of hysteresis as a function of the output level, such that the output level is configured to transition from low to high at a first trip point and to transition from high to low at a second trip point.

19. The method of claim 15, further comprising:
monitoring the output level to determine whether the output level is high;
monitoring a magnitude of the supply voltage to determine whether the magnitude of the supply voltage is greater than a threshold level; and
generating a protected output level as a function of monitoring the output level and of monitoring the magnitude of the supply voltage, such that the protected output level is configured to transition to high only when the output level is high and the magnitude of the supply voltage is greater than the threshold level.

20. The method of claim 15, further comprising:
adjusting the system voltage to generate the supply voltage.

21. A power-on reset device comprising:
a reference generator module, coupled with a supply voltage, and configured to generate a reference level at a reference level node, the reference level having a first temperature coefficient;
an input generator module, coupled with the supply voltage, and configured to generate an input level at an input level node, the input level having a second temperature coefficient, the second temperature coefficient being proportional to the first temperature coefficient;
a comparison module, comprising a positive input terminal and a negative input terminal, the positive input terminal being coupled with the input level node and the negative input terminal being coupled with the reference level node, the comparison module being configured to produce an upward transition in an output level when the input level on the positive input terminal exceeds the reference level on the negative input terminal, the input level exceeding the reference level defining a trip point, the trip point having a third temperature coefficient functionally related to a difference between the first temperature coefficient and the second temperature coefficient over a change in temperature; and an hysteresis module, configured to be enabled as a function of the output level to adjust a relationship between the supply voltage and the trip point, such that:
  the trip point occurs at a first magnitude of the supply voltage when the hysteresis module is enabled; and
  the trip point occurs at a second magnitude of the supply voltage when the hysteresis module is not enabled,
wherein the hysteresis module comprises:
  a switching block, configured to be switched to a first mode or a second mode as a function of the output level and to provide a first current path when switched to the first mode; and
  a load block, coupled in parallel with the switching block so as to provide a second current path when the switching block is switched to the second mode.

22. A power-on reset device comprising:
a reference generator module, coupled with a supply voltage, and configured to generate a reference level at a reference level node, the reference level having a first temperature coefficient;
an input generator module, coupled with the supply voltage, and configured to generate an input level at an input level node, the input level having a second temperature coefficient, the second temperature coefficient being proportional to the first temperature coefficient;
a comparison module, comprising a positive input terminal and a negative input terminal, the positive input terminal being coupled with the input level node and the negative input terminal being coupled with the reference level node, the comparison module being configured to produce an upward transition in an output level when the input level on the positive input terminal exceeds the reference level on the negative input terminal, the input level exceeding the reference level defining a trip point, the trip point having a third temperature coefficient functionally related to a difference between the first temperature coefficient and the second temperature coefficient over a change in temperature; and
an under-voltage protection module, configured to:
  monitor the output level to determine whether the output level is high;
  monitor a magnitude of the supply voltage to determine whether the magnitude of the supply voltage is greater than a threshold level; and
  transition a protected output level to high when the output level is high and the magnitude of the supply voltage is greater than the threshold level.

* * * * *